United States Patent [19]

Kayama

[11] 3,913,001

[45] Oct. 14, 1975

[54] CHOPPER-TYPE D-C AMPLIFYING SYSTEM

[75] Inventor: Nagaoki Kayama, Tokyo, Japan

[73] Assignee: Hokushin Electric Works, Ltd., Tokyo, Japan

[22] Filed: Dec. 3, 1973

[21] Appl. No.: 420,937

[30] Foreign Application Priority Data

Jan. 31, 1973 Japan ............................ 48-13221

[52] U.S. Cl. ..................... 321/2; 250/551; 321/18; 324/118; 330/10

[51] Int. Cl.$^2$ ........................................ H02M 3/28

[58] Field of Search ................. 321/2, 18; 324/118; 330/10; 250/551

[56] References Cited

UNITED STATES PATENTS 3,413,480 11/1968 Biard et al. ................. 250/551 UX

*Primary Examiner*—R. N. Envall, Jr.

[57] ABSTRACT

A D-C amplifying system for use in process control equipment or in other applications to convert a D-C input signal into an output signal suitable for transmission. The system includes a chopper to convert an error signal derived from the input signal and a feedback signal to an alternating signal which is applied to the light-emitting element of a photo-coupler acting as an isolator, light emitted by this element being picked up by a light sensitive element to produce an electrical signal which is applied to an output amplifier. A feedback circuit including isolation means is provided which is responsive to the output signal yielded by the output amplifier, which feedback circuit produces the feedback signal.

1 Claim, 3 Drawing Figures

PRIOR ART FIG. 1.

CHOPPER-TYPE D-C AMPLIFYING SYSTEM

BACKGROUND OF THE INVENTION

This invention relates generally to D-C amplifying systems, and more particularly to a chopper-type D-C amplifying system having input-output isolation means.

As is well known, in most process control equipment such as electronic controllers, converters and other forms of electronic circuits, use is made of a chopper-type D-C amplifying system in which the D-C input voltage to be amplified is converted into an output signal current more suitable for transmission. In such D-C amplifying systems, it is often necessary to include input-output isolation means in order to reduce interference from common-mode noise and to render the potential of the output circuit independent from that of the input circuit.

Input-output isolation is effected in a conventional chopper-type D-C amplifying system by a transformer in the error amplifying circuit and another transformer in the feedback circuit. In order to prevent undesirable electromagnetic and electrostatic induction effects, both transformers must be completely shielded. Also the transformer in the feedback circuit must have a highly accurate current transfer characteristic. These requirements add substantially to manufacturing costs.

Moreover, the need for two isolation transformers makes it difficult to minimize the space occupied by the amplifying system. While it is possible to use microelectronic, printed circuit and integrated circuit techniques to miniaturize transistors and other components, transformers do not lend themselves to such techniques. Thus in a chopper-type D-C amplifying system using two isolation transformers, the packaging space requirements are relatively large.

SUMMARY OF THE INVENTION

In view of the foregoing it is the main object of this invention to provide a low-cost, chopper-type D-C amplifying system having improved input-output isolation means.

Also an object of this invention is to provide a system of the above type whose packaging space can be made smaller than that of a conventional system.

Briefly stated, these objects are accomplished in a chopper-type D-C amplifying system wherein in lieu of the usual isolating transformer in the error amplifying circuit, use is made of a photo-coupler constituted by a light-emitting element and a light-sensing element.

OUTLINE OF THE DRAWINGS

For a better understanding of the invention as well as other objects and further features thereof, reference is made to the following detailed description to be read in conjunction with the accompanying drawings, wherein.

DESCRIPTION OF THE INVENTION

Prior Art

Figure 1:
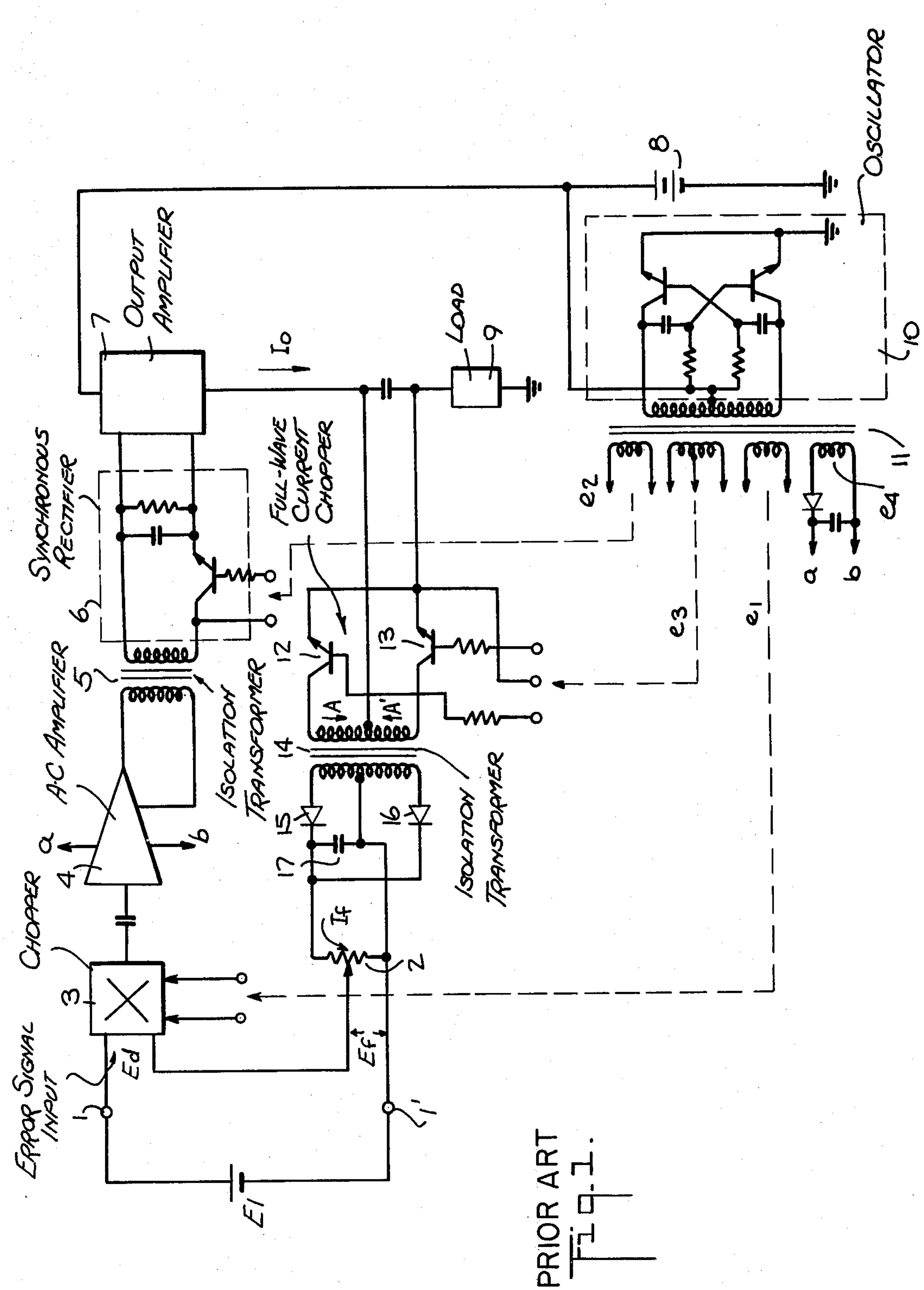
FIG. 1 is a schematic diagram of a prior-art chopper type D-C amplifying systems with input-output isolation.

Referring now to FIG. 1, there is shown the circuit of a prior art chopper-type D-C amplifying system of simple design, the system having input-output isolation. A more detailed description of the circuit may be found in Japanese Utility Model Application No. 39/20250/1964 Publication No. 48-3392.

In this circuit, an error signal $E_d$ is developed between an input D-C voltage represented by battery $E_1$ applied to terminals 1 and 1' and a feedback signal $E_f$ produced across potentiometer 2. Error signal $E_d$ is applied to the input of a chopper 3 wherein the error signal is converted to an A-C signal which is applied to an A-C amplifier 4.

The amplified A-C output from amplifier 4 is fed to a first input-output isolation transformer 5. The output of transformer 5 is demodulated by a synchronous rectifier circuit 6. The demodulated output of rectifier circuit 6 which is a D-C signal, is fed to an output amplifier 7 powered by a D-C source represented by battery 8. The output signal of output amplifier 7 is applied to a load 9, the output current being represented by symbol $I_o$.

Also provided is a full-wave current chopper including transistors 12 and 13 whose emitters are both connected to one end of load 9. The collectors of transistors 12 and 13 are connected to opposite ends of the primary winding of an isolation transformer 14 included in the feedback circuit of the system. The centertap of the primary of transformer 14 is connected to one of the output terminals of output amplifier 7.

The opposite ends of the secondary of transformer 14 are connected through rectifiers 15 and 16 to the upper end of feedback potentiometer 2, the centertap of the secondary being connected to the lower end of the potentiometer. The rectified current $I_f$ flowing through potentiometer 2 is therefore proportional to output current $I_o$ applied to the input of the current chopper, thereby generating feedback signal $E_f$ between the slider and the lower end of potentiometer 2. Capacitor 17 connected across potentiometer 2 is for smoothing the voltage developed thereacross.

The voltage source 8 also powers an oscillator generally designated by numeral 10, the oscillator circuit including the primary of a transformer 11 having a group of secondary windings providing oscillator outputs $e_1$, $e_2$, $e_3$, and $e_4$. Output $e_1$ is applied to chopper 3 to control its chopping rate, output $e_2$ is applied to synchronous-rectifier circuit 6 to control its operating rate and output $e_3$ is applied to the full-wave current chopper which includes transistors 12 and 13 to control its operating rate. Output $e_4$ of the oscillator is rectified to provide an isolated D-C voltage at terminals a and b, which D-C voltage is applied to the corresponding terminals of A-C amplifier 4.

In operation, transistors 12 and 13 of the current chopper are caused by oscillator voltage $e_3$ to switch alternately whereby the output current 10 passing through the primary winding of isolation transformer 14 changes its direction in every half cycle of the excitation, as indicated by arrows A and A'. As a consequence, an alternating square-wave current whose amplitude is proportional to output current $I_o$ flows through the secondary winding of transformer 14 and a D-C feedback current $I_f$ proportional to output current $I_o$ but isolated therefrom is obtained in the output of the full-wave rectifier circuit formed by diodes 15 and 16. This input-output isolation is realized by inserting transformer 5 in the error amplifier circuit and by inserting current transformer 14 in the feedback circuit, as well as by transformer 11 which provides isolated D-C and chopper exciting voltages.

A distinctive feature of this prior art type of D-C amplifying system is that by virtue of the fact that the feedback circuit has isolation means constituted by a current transformer and current-switching transistors, the feedback signal is not adversely affected by the inevitable set-off voltage of the current switching transistors. Thus a stable amplifying system is provided which is effectively insensitive to changes in the ambient temperature in the supply voltage. However, because this prior art system requires an isolation transformer in both the error amplifier circuit and in the feedback circuit, it has the drawbacks previously noted so that the manufacturing cost of the system is high and it is not possible to effect space economy.

First Embodiment

Figure 2:
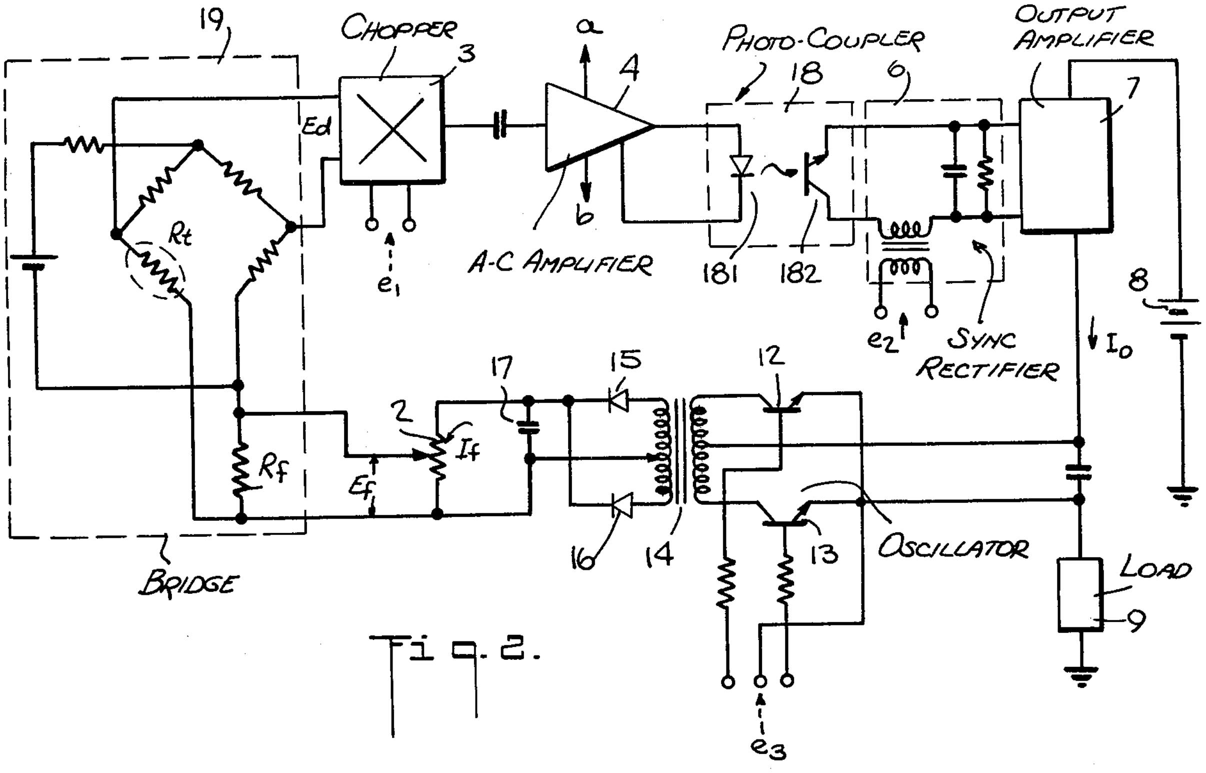
FIG. 2 is a schematic diagram of a first preferred embodiment of a chopper-type D-C amplifying system in accordance with the invention.

Referring now to FIG. 2, there is shown a chopper-type D-C amplifying system which overcomes the drawbacks of the system shown in FIG. 1 while retaining the advantages thereof. Those elements in FIG. 2 which are identical to elements in FIG. 1 are identified by like reference numerals.

In the system shown in FIG. 2, in place of an isolation transformer between A-C amplifier 4 and output amplifier 7, there is provided a photo-coupler, generally designated by numeral 18. Also in this arrangement, the input to chopper 3 is provided by a bridge 19, one of whose arms is formed by a resistance bulb $R_t$. A feedback signal $E_f$ generated at potentiometer 2 is applied across a fixed resistor $R_f$ connected in series with bulb $R_t$ in the bridge circuit. The error signal $E_d$ appearing in the output of bridge 19 is fed to chopper 3.

The output of A-C amplifier 4 is applied to a light emitting diode (LED) 181 in the photo-coupler, whereby LED 181 emits a light signal. This signal is received and sensed by photo-transistor 182 so as to convert the light signal into a corresponding electrical signal.

The electrical signal from photo-coupler 18 is applied to synchronous rectifier circuit 6 in which photo-transistor 182 functions as a demodulating switch element, the signal being converted into a D-C voltage signal which is applied to output amplifier 7 and converted into current output signal $I_o$. The system in FIG. 2 also includes an oscillator 10 and a transformer 11 as in FIG. 1, but to simplify the showing, these elements have been omitted from FIG. 2.

Though the relationship between the input current of LED 181 and the output current of photo-transistor 182 of the photo-coupler is not perfectly linear, the overall characteristics of the D-C amplifying system are not affected by this non-linearity in that the LED is inserted in the error amplifying circuit and the input vs. output characteristic is essentially determined by the current isolator consisting of the current chopper, the current transformer and the rectifier circuit in the feedback network as long as the loop gain thereof is maintained at a sufficiently high level.

In the first embodiment of the invention, since an accurate current chopper type of isolating means is employed in the feedback network, accurate amplification with low drift can be effected independently of the non-linearity of the photocoupler 18 included in the amplifying system. Moreover, since photo-coupler 18 has the advantage of being small in size and free from electromagnetic and electrostatic induction effects, it becomes possible to make a smaller and more accurate D-C amplifying system than with a conventional system having an isolation transformer.

While FIG. 2 shows one useful embodiment of a D-C amplifying system based on the principles underlying the invention, various changes may be made therein such as a modified input or feedback circuit and so on. For example, the input circuit may be altered to accept a D-C voltage input $E_1$ as in FIG. 1, rather than a bridge circuit as in FIG. 2. And the feedback circuit may be replaced with a non-linear circuit or a derivative and/or integral element whereby the D-C amplifying system may be made to carry out various process controller or other functions.

Second Embodiment

Figure 3:
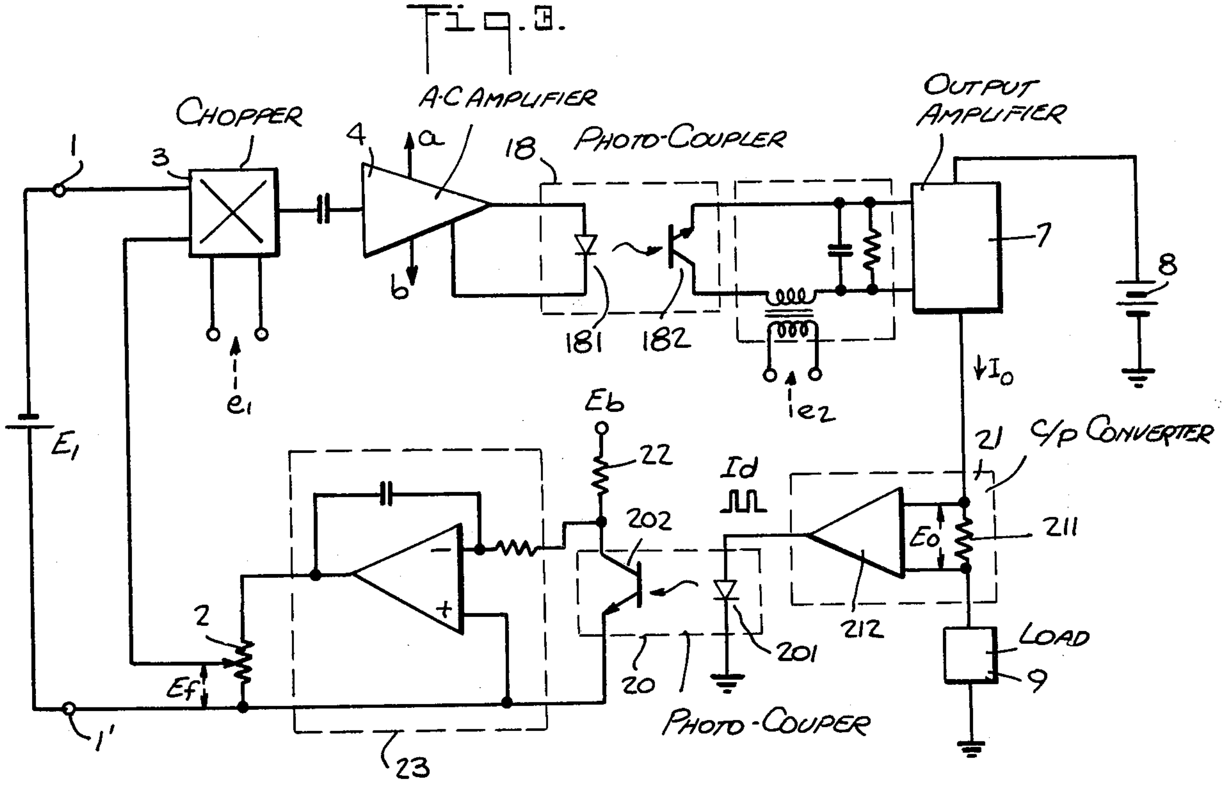
FIG. 3 is a schematic diagram of a second preferred embodiment of a chopper type D-C amplifying system.

In the system as shown in FIG. 2, the isolation transformer 5 included in the FIG. 1 arrangement is replaced by a photo-coupler 18 to replace isolation transformer 5 but in the system shown in FIG. 3 there is also a second photo-coupler 20 installed in the feedback circuit to replace isolation transformer 14. Thus no isolation transformers are employed in the second embodiment shown in FIG. 3.

The difference between the first and second embodiments of the invention will now be explained. In the second embodiment illustrated in FIG. 3, output current $I_o$ flows through a resistor 211 of a current-to-pulse duty cycle converter 21 wherein current $I_o$ is converted to a voltage signal $E_o$ proportional thereto. Voltage signal $E_o$ is converted into a pulse duty cycle signal $I_d$ having a duty cycle corresponding to $E_o$ by means, for example, of a circuit consisting of a voltage-to-frequency V/F converter and a one-shot multivibrator 212.

Pulse duty cycle signal $I_d$ is fed to the LED 201 of photo-coupler 20 so that the LED emits a light signal which is intercepted by the photo-transistor 202. The photo-transistor 202 whose collector is connected to a stabilized voltage source $E_b$ through a resistor 22, is switched on and off in accordance with the duty cycle of signal $I_d$.

The voltage signal at the junction of phototransistor 202 and resistor 22 is smoothed by an operational amplifier circuit 23 and converted to a D-C voltage signal proportional to the product of voltage $E_b$ and the duty cycle of pulse signal $I_d$. This D-C voltage is then applied to potentiometer 2 to provide the feedback signal $E_f$ which is fed into chopper 3.

In the second embodiment in accordance with the invention, the feed back signal will be balanced with respect to the input voltage signal $E_i$, when the overall gain of the D-C amplifier is sufficiently large. Under this balanced condition, the following equations will be established:

$$D = K_1 \cdot I_o \cdot R_o \quad (1)$$

$$E_f = K_2 \cdot D \cdot E_b \quad (2)$$

$$E_i = E_f \quad (3)$$

where $K_1$ and $K_2$ are constants, D is the duty cycle, $R_o$ is the resistance value of the resistor 211. The following equation may then be derived:

$$I_o = \frac{1}{K_1.K_2.R_o.E_b} \cdot E_i \quad (4)$$

From equation (4), it is apparent that output current $I_o$ is proportional to the input voltage $E_i$, if $E_b$,$K_1$, $K_2$ and $R_o$ are set constant. Also, it is apparent from equation (4) that division may be carried out assuming $E_b$ as a variable, since the output current $I_o$ is proportional to $E_i/E_b$.

As previously indicated, the accuracy of the D-C amplifying system depends on the characteristics of feed back circuit. In the second embodiment, the accuracy of the D-C amplifier is determined substantially by the characteristics of the current-to-pulse duty cycle converter 21 in the feed back circuit. The conversion technique for a current or voltage signal to a pulse duty signal having a duty cycle proportional to an analog signal is well known in the art and accurate conversion may be performed by use of known analog-to-digital conversion techniques.

Thus it is not difficult to make the characteristics of a feed back circuit including a photo-coupler 20 and a current-to-pulse duty cycle converter 21 equal to or higher than the characteristics of the feed back circuit including a current chopper composed of transistors 12 and 13 and a current transformer (FIGS. 1 and 2) by the use of the above-mentioned conversion technique.

Accordingly, in the second embodiment, transformers for isolation are not required and the circuit may be fabricated of small and inexpensive components. As a result, one is able to create a compact and accurate D-C amplifying system with input-output isolation.

Though in the embodiments shown in FIGS. 2 and 3, a photo-coupler consisting of an LED and a phototransistor is used, the LED may be replaced with other light-emitting devices such as a lamp, and the phototransistor may be replaced with other lightsensitive elements such as a photo-FET. The synchronous rectifier circuit 6 in FIGS. 2 and 3, the smoothing circuit 23 in FIG. 3 and so on may be changed to other circuits without departing from the essential concept of the invention as disclosed herein.

Furthermore, though a current output type of D-C amplifying system is illustrated in FIGS. 2 and 3, it is possible to set up a voltage output type of system by using proper converting means. It is also possible to use the pulse duty cycle signal $I_d$ as an output signal.

While there have been shown preferred embodiments of the invention it will be appreciated that many changes and modifications may be made without, however, departing from the essential spirit of the invention.

I claim:

1. A chopper-type D-C amplifying system having input-output isolation, said system comprising, A. means including a chopper to convert an error signal derived from the combination of said input D-C signal and a feedback signal to an alternating signal, B. a photo-coupler having a light-emitting element responsive to said alternating signal to produce a corresponding light signal and a light-sensitive element intercepting said light signal to produce an electrical signal, said lightsensitive element being constituted by a photo-transistor, C. a synchronous rectifier including said light sensitive element to demodulate said electrical signal to produce a D-C voltage signal;

D. an output amplifier coupled to said rectifier and responsive to said D-C voltage signal to produce a current output signal, E. a feedback circuit responsive to said current output signal and including isolation means to produce said feedback signal, said feedback circuit including a current-to-pulse duty cycle converter responsive to said current output signal, a photo-coupler having a light-emitting element responsive to the output of said converter to produce a corresponding light signal and a light-sensitive element intercepting said light signal to produce a corresponding electrical signal, and a duty cycle-to-voltage converter responsive to said electrical signal to produce the feedback signal applied to said chopper, and F. an oscillator producing an alternating voltage which is applied to said chopper to actuate same at a periodic rate, which alternating voltage is also applied to said synchronous rectifier to concurrently actuate same, said photo-transistor rectifying said alternating voltage.

* * * * *